United States Patent
Koo et al.

(10) Patent No.: US 9,934,875 B2
(45) Date of Patent: Apr. 3, 2018

(54) INTEGRATED CIRCUIT AND MEMORY DEVICE PERFORMING BOOT-UP OPERATION

(71) Applicant: SK hynix Inc., Gyeonggi-do (KR)

(72) Inventors: Ja-Beom Koo, Gyeonggi-do (KR); Jeong-Tae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 30 days.

(21) Appl. No.: 15/170,611

(22) Filed: Jun. 1, 2016

(65) Prior Publication Data

US 2017/0186501 A1    Jun. 29, 2017

(30) Foreign Application Priority Data

Dec. 23, 2015   (KR) .......................... 10-2015-0184919

(51) Int. Cl.
*G11C 29/00* (2006.01)
*G11C 17/16* (2006.01)
*G11C 29/44* (2006.01)

(52) U.S. Cl.
CPC .............. *G11C 29/78* (2013.01); *G11C 17/16* (2013.01); *G11C 2029/4402* (2013.01)

(58) Field of Classification Search
CPC ................................ G11C 29/78; G11C 17/16
See application file for complete search history.

(56) References Cited

U.S. PATENT DOCUMENTS

| | | | |
|---|---|---|---|
| 9,202,556 B1 * | 12/2015 | Kim | G11C 17/18 |
| 9,472,308 B1 * | 10/2016 | Hwang | G11C 29/76 |
| 2009/0190422 A1 * | 7/2009 | Khoja | G11C 17/18 |
| | | | 365/200 |
| 2010/0085075 A1 * | 4/2010 | Luzzi | H04L 9/0866 |
| | | | 326/8 |
| 2011/0058431 A1 * | 3/2011 | Gunwani | G11C 29/40 |
| | | | 365/189.16 |
| 2014/0181499 A1 | 6/2014 | Glod | |
| 2016/0300627 A1 * | 10/2016 | You | G11C 29/78 |

FOREIGN PATENT DOCUMENTS

KR    1020140124548    10/2014

* cited by examiner

*Primary Examiner* — Douglas King
(74) *Attorney, Agent, or Firm* — IP & T Group LLP

(57) ABSTRACT

An integrated circuit may include nonvolatile memory suitable for outputting stored data during the boot-up operation, one or more registers suitable for receiving the data output by the nonvolatile memory and storing the received data when the boot-up operation is performed, and one or more internal circuits suitable for operating using the data stored in the one or more registers. In no-update mode, although the boot-up operation is performed, a data update from the nonvolatile memory to the registers may not be performed.

14 Claims, 3 Drawing Sheets ably or only be performed in advance. Data transmitted to the repair registers and configuration registers 210_0 to 210_4 as a result of the boot-up operation needs to remain intact. Accordingly, a burn-in test on the nonvolatile memory circuit 201 and a burn-in test on the memory banks BK0 to BK3 and the configuration circuit

INTEGRATED CIRCUIT AND MEMORY DEVICE PERFORMING BOOT-UP OPERATION

CROSS-REFERENCE TO RELATED APPLICATION(S)

The present application claims priority of Korean Patent Application No. 10-2015-0184919 filed on Dec. 23, 2015, which is incorporated herein by reference in its entirety.

BACKGROUND

1. Field

Exemplary embodiments of the present invention relate to an integrated circuit and a memory device, and more particularly, to an integrated circuit and a memory device capable of performing a boot-up operation for transmitting data from a nonvolatile memory to latch circuits.

2. Description of the Related Art

FIG. 1 is a diagram illustrating a repair operation in a conventional memory device.

Referring to FIG. 1 the memory device includes a cell array 110 configured to include a plurality of memory cells, a row circuit 120 configured to activate a word line selected by a row address R_ADD, and a column circuit 130 configured to access for example, read or write a bit line selected by a column address C_ADD.

A row fuse circuit 140 stores a repair row address REPAIR_R_ADD corresponding to a fail memory cell within the cell array 110. A row comparison unit 150 compares the repair row address REPAIR_R_ADD with the row address R_ADD provided from the outside of the memory device. When the repair row address REPAIR_R_ADD is determined as identical with the row address R_ADD, the row comparison unit 150 controls the row circuit 120 to activate a redundancy word line instead of a word line designated by the row address R_ADD.

A column fuse circuit 160 stores a repair column address REPAIR_C_ADD corresponding to a fail memory cell within the cell array 110. A column comparison unit 170 compares the repair column address REPAIR_C_ADD with the column address C_ADD provided from the outside of the memory device. When the repair column address REPAIR_C_ADD is determined as identical with the column address C_ADD, the column comparison unit 170 controls the column circuit 130 to access a redundancy bit line instead of a bit line designated by the column address C_ADD.

Laser fuses are commonly used in the conventional fuse circuits 140 and 160. The laser fuse stores data of "high" or "low" depending on whether a fuse has been cut. The laser fuse is able to be programmed in a wafer state, but is unable to be programmed after a package is mounted on the inside of a package. Furthermore, the laser fuse is unable to be designed with a small area due to a limit to a pitch.

In order to overcome such disadvantages one of nonvolatile memory circuits, such as an E-fuse array circuit, NAND flash memory, NOR flash memory, erasable programmable read only memory (EPROM), electrically erasable programmable read only memory (EEPROM), ferroelectric RAM (FRAM), and magnetoresistive RAM (MRAM) as is included in a memory device. Repair information is stored in the nonvolatile memory circuit.

FIG. 2 is a diagram illustrating an example in which a nonvolatile memory circuit is used to store repair information in a memory device.

Referring to FIG. 2, the memory device includes a plurality of memory banks BK0 to BK3, repair registers 210_0 to 210_3 corresponding to the memory banks BK0 to BK3 and configured to store repair data, configuration registers 210_4 configured to store configuration data, a configuration circuit 220, and a nonvolatile memory circuit 201.

The nonvolatile memory circuit 201 corresponds to the fuse circuits 140 and 160 of FIG. 1. Repair addresses corresponding to all of the memory banks BK0 to BK3 are stored in the nonvolatile memory circuit 201. Furthermore, configuration data for the operation of the memory device is stored in the nonvolatile memory circuit 201. The nonvolatile memory circuit 201 may include any one of an E-fuse array circuit, NAND flash memory, NOR flash memory, EPROM, EEPROM, FRAM, and MRAM.

The repair registers 210_0 to 210_3 store the repair data of the memory banks BK0 to BK3 respectively. Furthermore, the configuration registers 210_4 store configuration data to be used in the configuration circuit 220. The configuration circuit 220 may configure various types of configuration values for the operation of the memory device for example, internal voltage levels and various types of latency based on the configuration data stored in the configuration registers 210_4. The repair registers and configuration registers 210_0 to 210_4 may store repair data during power-on of the memory device. Repair data and configuration data to be stored in the repair registers and configuration registers 210_0 to 210_4 are provided by the nonvolatile memory circuit 201. The nonvolatile memory circuit 201 sends repair data which are stored therein at a point in time at which a boot-up signal BOOTUP is enabled, to the repair registers 210_0 to 210_3, and sends configuration data to the configuration registers 210_4.

It takes additional time to fetch data stored in the nonvolatile memory circuit 201 due to long read latency of the nonvolatile memory circuit 201. Since data stored in the nonvolatile memory circuit 201 cannot be immediately fetched, it is impossible to perform a repair operation in a timely manner directly based on the data stored in the nonvolatile memory circuit 201. Therefore, repair data and configuration data stored in the nonvolatile memory circuit 201 are transmitted and stored in the repair registers and configuration registers 210_0 to 210_4. The repair data and configuration data stored in the repair registers and configuration registers 210_0 to 210_4 are used for the repair operation of the memory banks BK0 to BK3 and the configuration operation of the configuration circuit 220. The transmission process of the repair data and configuration data from the nonvolatile memory circuit 201 to the repair registers and configuration registers 210_0 to 210_4 is called a boot-up operation. Only when a boot-up operation is completed, will the memory device be able to start normal operations after repairing fail cells and performing various types of configuration operations.

When a memory device is tested, a burn-in test is commonly performed that applies stress by repeatedly driving the elements of the memory device. For the burn-in test on the memory banks BK0 to BK3 and the configuration circuit 220, the boot-up operation needs to be performed in advance. Data transmitted to the repair registers and configuration registers 210_0 to 210_4 as a result of the boot-up operation needs to remain intact. Accordingly, a burn-in test on the nonvolatile memory circuit 201 and a burn-in test on the memory banks BK0 to BK3 and the configuration circuit 220 are unable to be simultaneously performed. This becomes a major cause of a longer test time.

SUMMARY

Various embodiments are directed to a technology for testing a nonvolatile memory configured to store data for the operation of an integrated circuit or memory device simultaneously with other elements within the integrated circuit or the memory device.

In an embodiment, an integrated circuit may include nonvolatile memory suitable for outputting stored data during the boot-up operation, one or more registers suitable for receiving the data output by the nonvolatile memory and storing the received data when the boot-up operation is performed, and one or more internal circuits suitable for operating using the data stored in the one or more registers. In no-update mode, although the boot-up operation is performed, a data update from the nonvolatile memory to the registers may not be performed.

The integrated circuit may further include a transmission unit suitable for sending the data output by the nonvolatile memory to the one or more registers when the boot-up operation is performed and being deactivated in the no-update mode.

In no-update mode, data already stored in the one or more registers may be maintained without any changes. Furthermore, no-update mode may be set during a burn-in test on the integrated circuit. Furthermore, in no-update mode, the boot-up operation of the nonvolatile memory may be repeatedly performed.

In an embodiment, a memory device may include nonvolatile memory suitable for storing repair data and configuration data and outputting the stored data during the boot-up operation, one or more repair registers suitable for receiving the repair data output by the nonvolatile memory and storing the received repair data when the boot-up operation is performed, one or more configuration registers suitable for receiving the configuration data output by the nonvolatile memory and storing the received configuration data when the boot-up operation is performed, one or more memory banks suitable for replacing a fail cell with a redundancy cell using the repair data stored in the one or more repair registers, and a configuration circuit suitable for performing a configuration operation using the configuration data stored in the one or more configuration registers. In no-update mode, although the boot-up operation is performed, a data update from the nonvolatile memory to the one or more repair registers and the one or more configuration registers may not be performed.

The memory device may further include a transmission circuit suitable for sending the data output by the nonvolatile memory to the one or more repair registers and the one or more, configuration registers when the boot-up operation is performed, and being deactivated in no-update mode.

In an embodiment, an operating method of an integrated circuit may include performing a boot-up operation for sending data stored in nonvolatile memory to one or more registers and storing the data in the one or more registers, blocking the transfer of data from the nonvolatile memory to the one or more registers, and performing a test operation on one or more internal circuits operating using the data stored in the one or more registers and a test operation on the nonvolatile memory.

Data stored in the one or more registers prior to the blocking of the transfer of the data may be maintained without any changes even after the blocking of the transfer of the data.

DETAILED DESCRIPTION

Figure 1:
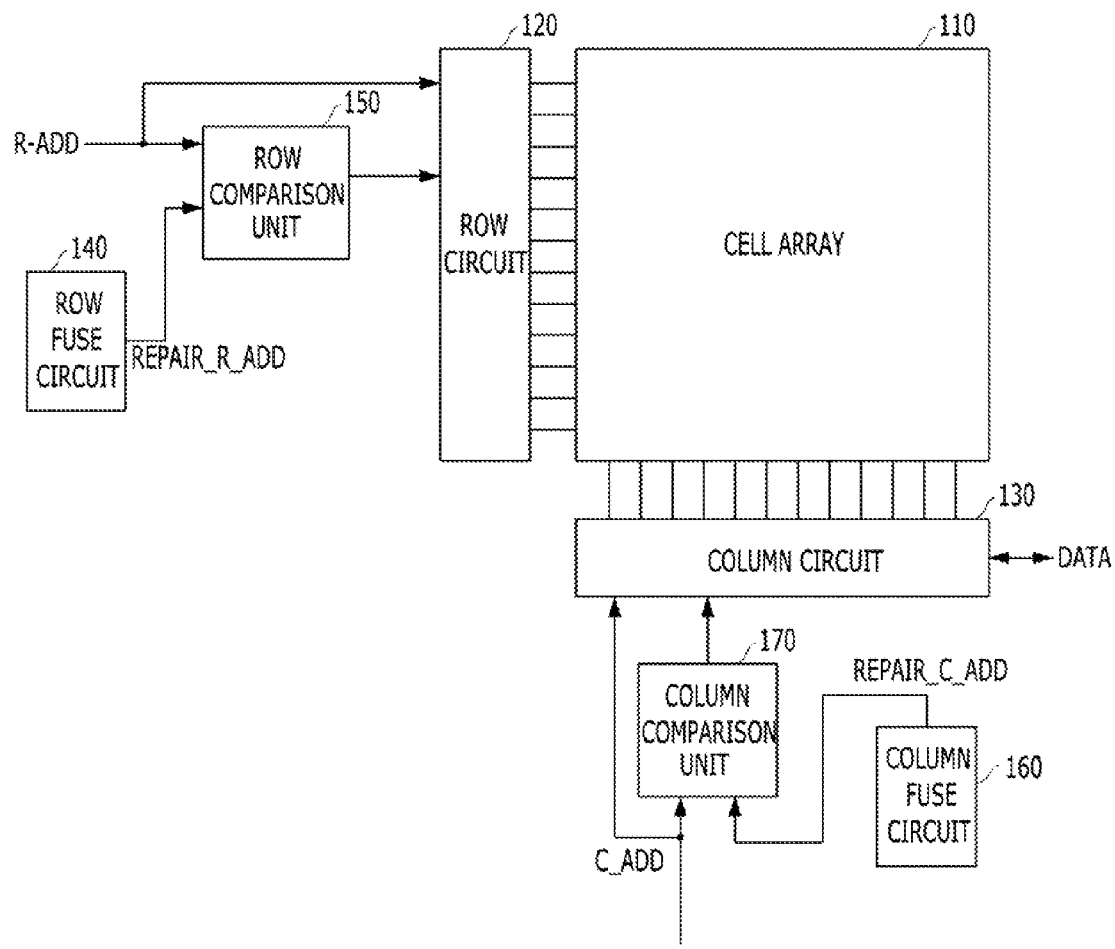
FIG. 1 is a diagram illustrating a repair operation in a conventional memory device.
Figure 2:
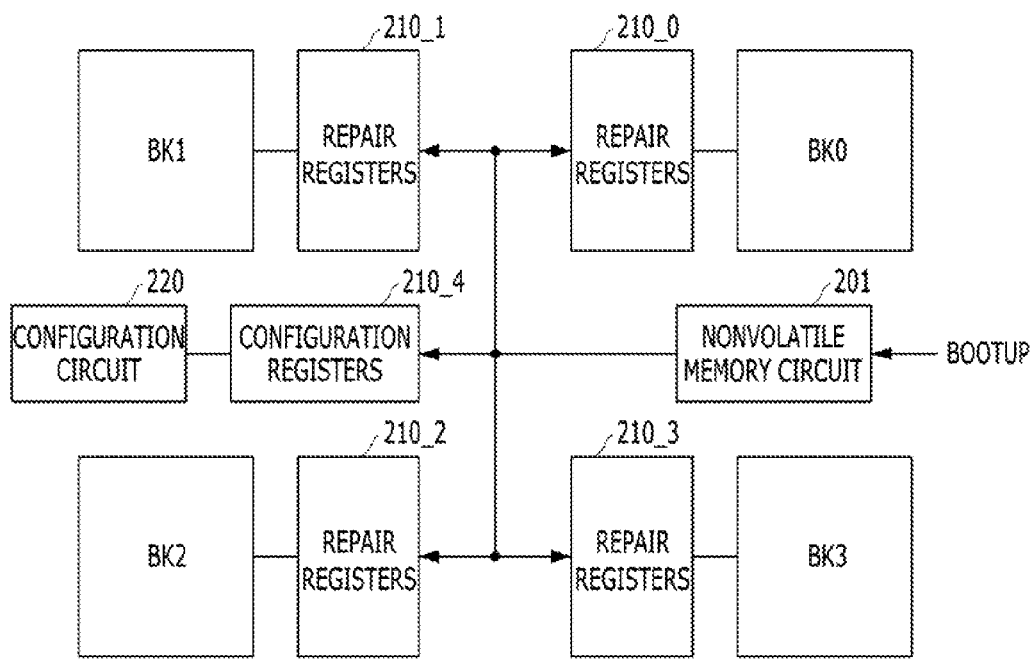
FIG. 2 is a diagram illustrating an example in which nonvolatile memory circuit is used to store repair information in a memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
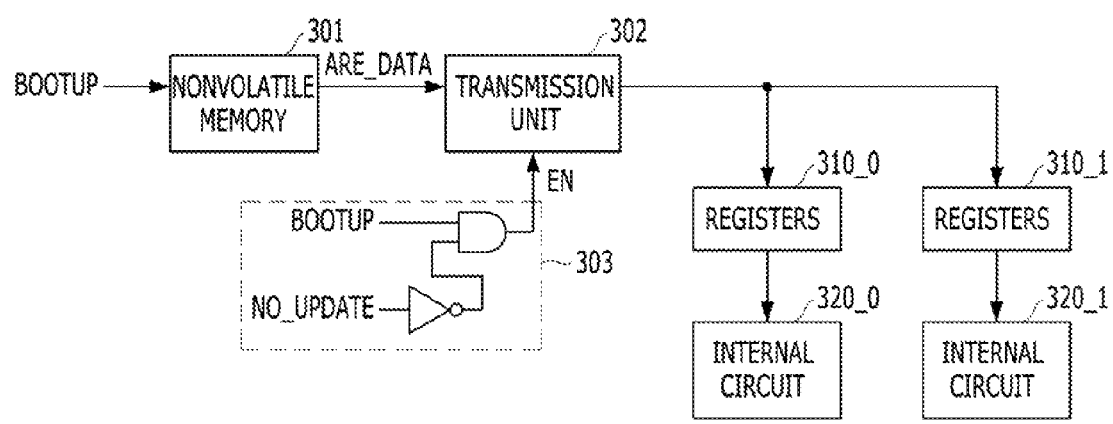
FIG. 3 is a diagram illustrating the configuration of an integrated circuit in accordance with an embodiment of the present invention.

FIG. 3 is a diagram showing the configuration of an integrated circuit in accordance with an embodiment of the present invention.

Referring to FIG. 3, the integrated circuit may include nonvolatile memory 301, a transmission unit 302, a transmission control unit 303, registers 310_0 and 310_1, and internal circuits 320_0 to 320_1.

The nonvolatile memory 301 may store data to be used in the internal circuits 320_0 to 320_1. The nonvolatile memory 301 may sequentially output data ARE_DATA stored therein in response to the activation of the boot-up signal BOOTUP. The nonvolatile memory 301 may include any one of various types of nonvolatile memory, such as an E-fuse array, NAND flash memory, NOR flash memory, EPROM, EEPROM, FRAM, and MRAM. A boot-up signal BOOTUP may be enabled during the boot-up operation.

The transmission unit 302 may transfer the data ARE_DATA from the nonvolatile memory 301 to the registers 310_0 and 310_1. The activation/deactivation of the transmission unit 302 may be controlled by the transmission control unit 303. The transmission control unit 303 may activate the transmission unit 302 by enabling an enable signal EN to "high" when the boot-up signal BOOTUP is enabled to "high". In contrast, when a no-update mode signal NO_UPDATE is enabled to "high", the transmission control unit 303 may deactivate the transmission unit 302 by disabling the enable signal EN to "low" regardless of a level of the boot-up signal BOOTUP. That is, the transmission unit 302 is basically activated during the boot-up operation, but may remain deactivated in no-update mode, during which the no-update mode signal NO_UPDATE is enabled to "high" regardless of the boot-up operation. The transmission control unit 303 may include an AND gate and an inverter, as shown in FIG. 3.

The registers 310_0 to 310_3 may store the transferred data ARE_DATA for the operation of the internal circuits 320_0 to 320_3, respectively. The data ARE_DATA stored in the registers 310_0 to 310_3 may be provided from the nonvolatile memory 301 through the transmission unit 302 during the boot-up operation. In no-update mode, even during the boot-up operation, data ARE_DATA already stored in the registers 310_0 to 310_3 may be maintained without any changes because the transfer of new data from the nonvolatile memory 301 to the registers 310_0 to 310_3 is blocked by the deactivated transmission unit 302.

The internal circuits 320_0 and 320_1 may operate according to the data ARE_DATA stored in the registers 310_0 and 310_1. For example, the internal circuit 320_0 generates internal voltages used therein. The levels of the internal voltages may be controlled according to the data ARE_DATA stored in the registers 310_0. Furthermore the internal circuit 320_1 may repair an error therein based on the data ARE_DATA stored in the registers 310_1.

FIG. 3 illustrates an example in which during the no-update mode a data update from the nonvolatile memory 301 to the registers 310_0 and 310_1 is not performed due to the transfer of data from the nonvolatile memory 301 to the registers 310_0 and 310_1 being blocked by the deactivated transmission unit 302 during the boot-up operation. In some embodiments, a data update from the nonvolatile memory 301 to the registers 310_0 and 310_1 may be blocked in a different manner from the above description of the no-update mode. For example, during the boot-up operation in the no-update mode, data ARE_DATA is transmitted from the nonvolatile memory 301 to the registers 310_0 and 310_1, but a data update from the nonvolatile memory 301 to the registers 310_0 and 310_1 may be blocked due to blockage, of data input to the registers 310_0 and 310_1.

Figure 4:
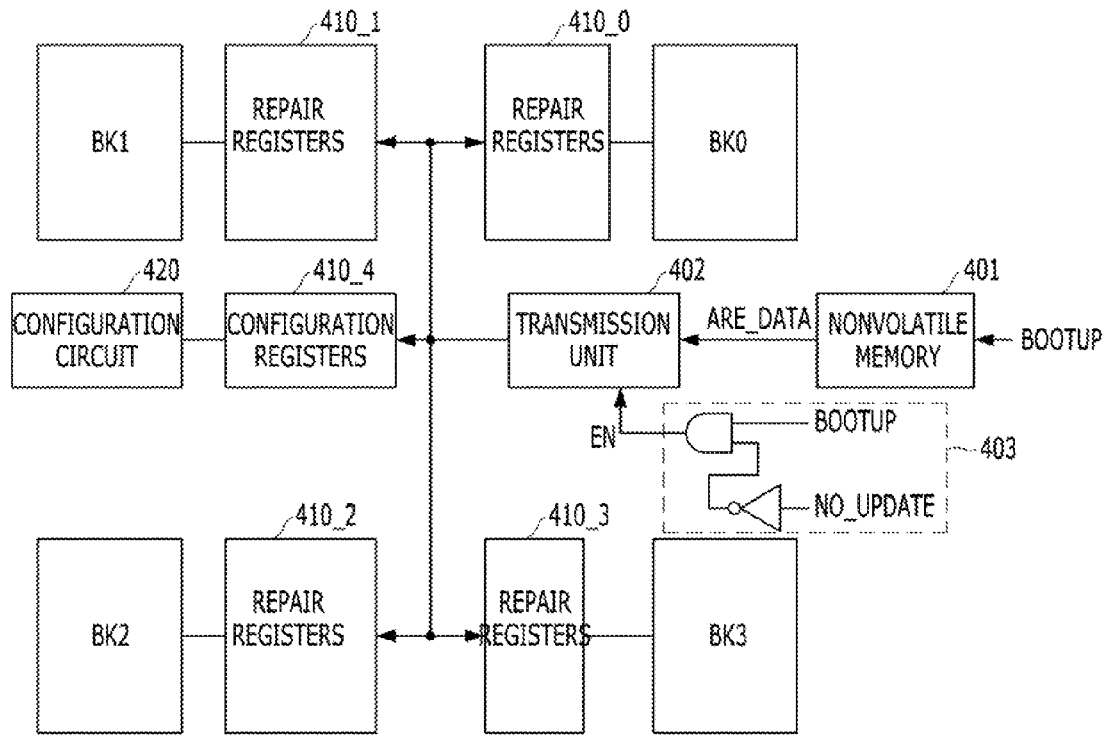
FIG. 4 is a diagram illustrating the configuration of a memory device in accordance with an embodiment of the present invention.

FIG. 4 is a diagram showing the configuration of a memory device in accordance with an embodiment of the present invention. The integrated circuit of FIG. 3 exemplarily corresponds to a memory device of FIG. 4.

Referring to FIG. 4, the memory device may include nonvolatile memory 401, a transmission unit 402, a transmission control unit 403, repair registers 410_0 to 410_3, configuration registers 410_4, memory banks BK0 to BK3, and a configuration circuit 420.

The nonvolatile memory 401 may store repair data used in the memory banks BK0 to BK3 and configuration data used in the configuration circuit 420. The nonvolatile memory 401 may sequentially output data ARE_DATA stored therein in response to the activation of the boot-up signal BOOTUP. The nonvolatile memory 401 may include any one of various types of nonvolatile memory, such as an E-fuse array, NAND flash memory, NOR flash memory, EPROM, EEPROM, FRAM, and MRAM.

The transmission unit 402 may transfer the data ARE_DATA from the nonvolatile memory 401 to the repair registers 410_0 to 410_3 and the configuration registers 410_4. The activation/deactivation of the transmission unit 402 may be controlled by the transmission control unit 403. The transmission control unit 403 may activate the transmission unit 402 by enabling the enable signal EN to "high" when the boot-up signal BOOTUP is enabled to "high". In contrast, when the no-update mode signal NO_UPDATE is enabled to "high", the transmission control unit 403 may deactivate the transmission unit 402 by disabling the enable signal EN to low regardless of a level of the boot-up signal BOOTUP. That is, the transmission unit 402 is basically activated during the boot-up operation, but may stay deactivated in the no-update mode, during which the no-update mode signal NO_UPDATE is enabled to "high", regardless of the boot-up operation. The transmission control unit 403 may include an AND gate and an inverter, as shown in FIG. 4.

The repair registers 410_0 to 410_3 may store the transferred repair data used in the memory banks BK0 to BK3. The repair data stored in the repair registers 410_0 to 410_3 may be provided from the nonvolatile memory 401 during the boot-up operation. In the no-update mode even during the boot-up operation, the repair data already stored in the repair registers 410_0 to 410_3 may be maintained without any changes due to the transfer of new repair data from the nonvolatile memory 401 to the repair registers 410_0 to 410_3 being blocked by the deactivated transmission unit 402.

The transferred configuration data used in the configuration circuit 420 may be stored in the configuration registers 410_4. The configuration data stored in the configuration registers 410_4 may be provided from the nonvolatile memory 401 during the boot-up operation. In the no-update mode, during the boot-up operation, the configuration data already stored in the configuration registers 410_4 may be maintained without any changes due to the transfer of new configuration data from the nonvolatile memory 401 to the configuration registers 410_4 being blocked by the deactivated transmission unit 402.

Each of the memory banks BK0 to BK3 may include a cell array and circuits configured to read/write data from/to the cell array. Furthermore, each of the memory banks BK0 to BK3 may perform the repair operation for replacing a fail cell with a redundancy cell within each cell array using repair data stored in the corresponding repair registers 410_0 to 410_3. The number of repair registers 410_0 to 410_3 may be determined according to the number of redundancy cells included in corresponding memory banks BK0 to BK3. For example, when the memory bank BK2 has 100 redundancy cells, the number of corresponding repair registers 410_2 may be 100, which is capable of storing 100 fail addresses.

The configuration circuit 420 may perform the configuration operation to the memory device using configuration data stored in the configuration registers 410_4. For example, the configuration circuit 420 may set the levels of various internal voltages, such as a core voltage and reference voltage used in the memory device, and may set various types of parameter values such as the latency of the memory device. The number of configuration registers 410_4 used by the configuration circuit 420 may be different depending on the type of configuration operation performed by the configuration circuit 420.

FIG. 4 shows an example in which in the no-update mode a data update from the nonvolatile memory 401 to the repair registers 410_0 and 410_3 and the configuration registers 410_4 is not performed due to the transfer of data from the nonvolatile memory 401 to the repair registers 410_0 and 410_3 and the configuration registers 410_4 being blocked by the deactivated transmission unit 402 during the boot-up operation. In some embodiments, a data update from the nonvolatile memory 401 to the repair registers 410_0 and 410_3 and the configuration registers 410_4 may be blocked in different manner from the above description in the no-update mode. For example, during the boot-up operation in the no-update mode, data ARE_DATA is transmitted from the nonvolatile memory 401 to the repair registers 410_0 and 410_3 and the configuration registers 410_4, but the data update from the nonvolatile memory 401 to the repair registers 410_0 and 410_3 and the configuration registers 410_4 may be blocked by blockage of data input to the repair registers 410_0 and 410_3 and the configuration registers 410_4.

Figure 5:
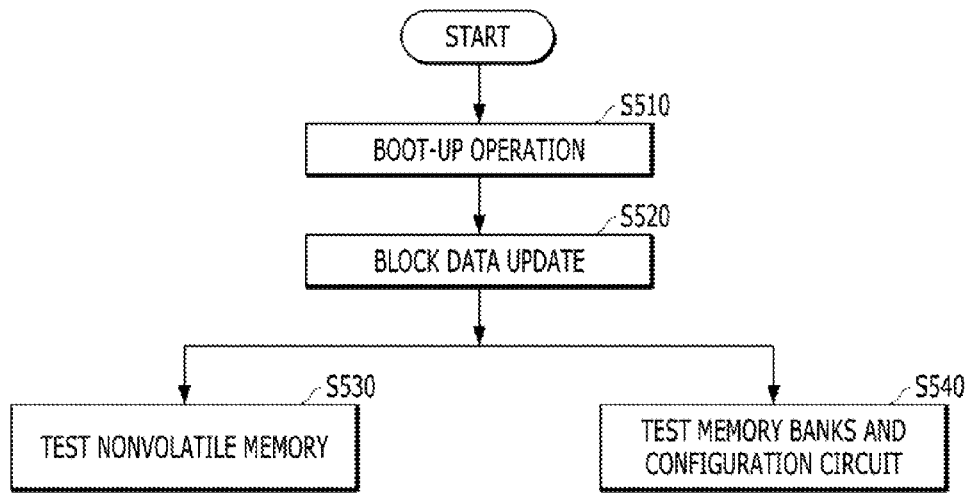
FIG. 5 is a diagram illustrating the operation of the memory device of FIG. 4.

FIG. 5 is a diagram illustrating the operation of the memory device of FIG. 4. A process in which a test on the memory device is described below with reference to FIG. 5.

Referring to FIG. 5 the boot-up operation may be performed at step S510. During the boot-up operation, the repair data may be transmitted from the nonvolatile memory 401 to the repair registers 410_0 to 410_3, and the configuration data may be transmitted from the nonvolatile memory 401 to the configuration registers 410_4. Furthermore, during the boot-up operation, the memory banks BK0 to BK3 may perform the repair operation using the repair data stored in the repair registers 410_0 to 410_3, and the configuration circuit 420 may perform the configuration operation using the configuration data stored in the configuration registers 410_4. That is, during the boot-up operation, the memory banks BK0 to BK3 and the configuration circuit 420 may perform normal operations.

The data update for the repair registers 410_0 to 410_3 and the configuration registers 410_4 may be blocked at step S520. The data update may be blocked by the transmission unit 402 deactivated through the enabled no-update mode signal NO_UPDATE. When the data update is blocked, the nonvolatile memory 401, the memory banks BK0 to BK3, and the configuration circuit 420 may be independently tested since the repairs and configuration data stored in the repair registers 410_0 to 410_3 and the configuration registers 410_4 is maintained without any changes.

A test on the nonvolatile memory 401 may be performed at step S530. In this case, the test may be the burn-in test and the boot-up operation of the nonvolatile memory 401 may be repeatedly performed. Although the boot-up operation of the nonvolatile memory 401 is repeatedly performed, there may be no influence on the operations of the memory banks BK0 to BK3 and the configuration circuit 420 since the data update for the repair registers 410_0 to 410_3 and the configuration registers 410_4 has been blocked.

The test on the memory banks BK0 to BK3 and the configuration circuit 420 may be performed at step S540 simultaneously with the test on the nonvolatile memory 401 of step S530. In this case, the test may be the burn-in test. The read/write operation of the memory banks BK0 to BK3 may be repeatedly performed, and the operation of the configuration circuit 420 may be repeatedly performed.

In accordance with the embodiments of the present invention, nonvolatile memory configured to store data for the operation of an integrated circuit or memory device and other elements can be tested at the same time within the integrated circuit or the memory device.

Although various embodiments have been described for illustrative purposes, it will be apparent to those skilled in the art that various changes and modifications may be made without departing from the spirit and scope of the invention as defined in the following claims.

What is claimed is:

1. An integrated circuit, comprising:
   a nonvolatile memory configured to output stored data during a boot-up operation;
   one or more registers configured to store the output data of the nonvolatile memory during the boot-up operation, wherein a data update from the nonvolatile memory to the registers is not performed in a no-update mode; and
   one or more internal circuits configured to operate based on the data stored in the registers.

2. The integrated circuit of claim 1, further comprising a transmission unit configured to transfer the output data of the nonvolatile memory to the registers in a mode other than the no-update mode.

3. The integrated circuit of claim 2, further comprising a transmission control unit configured to activate the transmission unit to transfer the output data of the nonvolatile memory to the registers in the mode other than the no-update mode, and deactivate the transmission unit in the no-update mode.

4. The integrated circuit of claim 1, wherein in the no-update mode, data already stored in the registers is maintained without any changes.

5. The integrated circuit of claim 1, wherein the no-update mode is set during a burn-in test on the integrated circuit.

6. The integrated circuit of claim 5, wherein in the no-update mode, the boot-up operation of the nonvolatile memory is repeatedly performed.

7. A memory device, comprising:
   a nonvolatile memory configured to output repair data and configuration data during a boot-up operation;
   one or more repair registers configured to store the output repair data during the boot-up operation;
   one or more configuration registers configured to store the output configuration data during the boot-up operation;
   one or more memory banks configured to perform a repair operation using the repair data stored in the repair registers; and
   a configuration circuit configured to perform a configuration operation using the configuration data stored in the configuration registers,
   wherein a data update from the nonvolatile memory to the repair and configuration registers is not performed in a no-update mode.

8. The memory device of claim 7, further comprising a transmission circuit configured to transfer the output repair and configuration data of the nonvolatile memory to the repair and configuration registers in a mode other than the no-update mode.

9. The memory device of claim 8, further comprising a transmission control unit configured to activate the transmission circuit to transfer the output data of the nonvolatile memory to the registers in the mode other than the no-update mode, and deactivate the transmission circuit in the no-update mode.

10. The memory device of claim 7, wherein in the no-update mode, the repair and configuration data already stored in the repair and configuration registers are maintained without any changes.

11. The memory device of claim 7, wherein the no-update mode is set during a burn-in test on the memory device.

12. The memory device of claim 11, wherein in the no-update mode, the boot-up operation of the nonvolatile memory is repeatedly performed.

13. An operating method of an integrated circuit including a nonvolatile memory, and one or more registers for corresponding internal circuits, the operating method comprising:
   performing a boot-up operation for storing data output from the nonvolatile memory in the registers;
   blocking a transfer of data from the nonvolatile memory to the registers in a no-update mode during the boot-up operation; and
   performing a test operation on the internal circuits using the data stored in the registers, and a test operation simultaneously on the nonvolatile memory.

14. The operating method of claim 13, wherein data stored in the registers prior to the blocking of the transfer in the no-update mode is maintained without any changes even after the blocking of the transfer.

\* \* \* \* \*